United States Patent [19]
Atarashi et al.

[11] Patent Number: 5,705,854
[45] Date of Patent: Jan. 6, 1998

[54] COOLING APPARATUS FOR ELECTRONIC DEVICE

[75] Inventors: Takayuki Atarashi, Tsuchiura; Tetsuya Tanaka, Ibaraki-ken; Takahiro Daikoku, Ushiku, all of Japan

[73] Assignee: Hitachi, Ltd., Japan

[21] Appl. No.: 632,618

[22] Filed: Apr. 15, 1996

[30] Foreign Application Priority Data

Apr. 14, 1995 [JP] Japan ................................ 7-089023

[51] Int. Cl.$^6$ ........................................... H01L 23/34
[52] U.S. Cl. ........................ 257/721; 257/723; 361/697
[58] Field of Search .............................. 257/721, 723; 361/697, 687, 688, 689, 704, 724

[56] References Cited

U.S. PATENT DOCUMENTS

| | | | |
|---|---|---|---|
| 5,570,740 | 11/1996 | Flores et al. | 361/697 |
| 5,576,932 | 11/1996 | Bishop et al. | 257/721 |
| 5,592,363 | 1/1997 | Atarashi et al. | 361/689 |

FOREIGN PATENT DOCUMENTS 2-34993  2/1990  Japan .

*Primary Examiner*—Tom Thomas
*Assistant Examiner*—Roy Potter
*Attorney, Agent, or Firm*—Evenson, McKeown, Edwards & Lenahan, P.L.L.C.

[57] ABSTRACT

A cooling apparatus for electronic devices which is capable of reducing the flow resistance in an exhaust air flow passage to lessen noises and to improve the cooling performance of heat sinks when heat-generating semiconductor parts are very tightly mounted in a plane or when the calorific value of the heat-generating semiconductor parts is extremely large. In addition, the cooling apparatus realizes uniform air quantity distribution and uniform temperature distribution to the heat-generating semiconductor parts. Heat sinks 13 are respectively attached onto a plurality of heat-generating semiconductor parts 12a, 12b and 12c on a board 11. Further, nozzles 14 are respectively provided on the opposite side surfaces of heat-generating semiconductor part fitted surfaces of the heat sinks 13. The nozzles 14 have a substantially rectangular cross section parallel to the board, and are designed such that, when the ratio of the distance between the adjacent heat sinks to the pitch of the plurality of mounted heat sinks is not less than 0.00 but below 0.02, the ratio of the width of the nozzles 14 in the direction (X direction) that a refrigerant flows within the heat sinks 13 to the width of the heat sinks 13 is not less than 0.16 and not more than 0.35.

16 Claims, 5 Drawing Sheets

COOLING APPARATUS FOR ELECTRONIC DEVICE

BACKGROUND OF THE INVENTION

The present invention relates to a cooling apparatus for electronic devices.

Processing electronic apparatuses have been proposed which incorporate a plurality of heat-generating semiconductor devices mounted on a circuit board such as a printed circuit board or a ceramics board. A typical convenional system for cooling semiconductor devices employs cooling fins provided on each such semiconductor device, with cooling air supplied from one to the other side of the electronic apparatus so as to successively cool the heat-generating semiconductor devices. This conventional cooling system, however, cannot cope with the current trend for increasing rates of heat generation by the semiconductor devices in electronic apparatuses of the kind described. Namely, the cooling air after cooling upstream semiconductor devices is heated to a temperature which is too high to efficiently cool downstream semiconductor devices. Under this circumstance, in, for example, Japanese Patent Unexamined Publication No.2-34993, a cooling system is proposed in which a heat sink having a large heat-dissipating area and, hence, excellent cooling performance is provided on each of the heat-generating semiconductor devices and cooling air is uniformly and separately supplied, without substantial leakage of the air, to the heat sink of the heat-generating semiconductor devices by a chamber and nozzles disposed above the heat sink.

This known cooling appratus for electronic devices will be described with reference to FIGS. 5 and 6. Referring to FIG. 5, an electronic apparatus includes a circuit board 1 and a plurality of heat-generating LSIs 2 mounted on the circuit board 1. A heat sink 3 employing cooling fins is provided on each LSI 2, and cooling air is supplied from a chamber 4 onto the LSIs 2 through respective nozzles 5 thereby cooling the LSIs 2. After cooling the heat sink, the air is relieved into an air discharge space 8 formed between adjacent heat sinks 3 through an opening 6, and is discharged through the discharge space 8 in the direction of the arrow 7.

As shown in FIG. 6, the LSIs 2 with their heat sinks 3 are arranged in the form of a regular matrix having plural rows and columns so that air portions 9 from the heat sinks 3 of adjacent columns merge and are discharged in the same direction as indicated by an arrow 10.

Thus, in this known cooling system, each space between adjacent columns of the LSIs 2 or heat sinks 3 form an air discharge passage through which the air fractions, after cooling the semiconductor devices of the adjacent columns, are discharged to the exterior.

The current trend towards higher operation speed and higher packaging density of semiconductor devices of electronic apparatuses requires that the heat-generating semiconductor devices are arranged with a high density or that heat generated by the semiconductor devices is very high, making it difficult to preserve ample space for discharging air between adjacent heat-generating semiconductor devices. Consequently, various problems are encountered.

More particularly, it is difficult to form an air discharge space large enough to receive and discharge air between the adjacent semiconductor devices or heat sinks. Consequently, if the cooling air is supplied to each heat sink at the required rate, the cooling air fractions from these heat sinks successively rush into the common discharge passage of the limited volume, so as to merge and form a high velocity air flow. This results in serious increase in the flow resistance encountering the flow of the air to be discharged. The increased flow velocity also may lead to higher level of fluid noise. Moreover, if the power for forcibly supplying the cooling air is limited, the rate of supply of the cooling air is reduced, thus impairing cooling performance.

The increase of the flow resistance in the air discharge passage also poses a problem that the cooling air cannot uniformly supplied to all the heat-generating semiconductor devices, because the heat sinks which are closer to the outlet of the cooling passage can receive air at sufficiently large rates, whereas the heat sinks remote from the outlet of the cooling passage cannot be supplied with the cooling air at sufficiently large rates. Such an uneven distribution of air supply rates causes a non-uniform temperature distribution over the heat-generating semiconductor devices of the electronic device.

SUMMARY OF THE INVENTION

In view of the technical problems described above, the present invention aims at providing a cooling apparatus for electronic devices in which, despite a very high density of mounting of heat-generating semiconductor parts on a plane or very large rates of heat generation of semiconductor parts, the flow resistance along the path of cooling air is reduced.

It is an object of the present invention to provide a cooling apparatus for electronic devices in which uniform flow rate distribution of a cooling medium and, hence, uniform temperature ditribution, are developed over a plurality of heat-generating semiconductor parts packaged in the electronic device.

For these purposes, there is provided a cooling apparatus for an electronic device comprising a plurality of heat-generating semiconductor parts mounted on a board and a plurality of heat sinks attached onto the plurality of heat-generating semiconductor parts, respectively, to be thermally coupled thereto to dissipate heat of the heat-generating semiconductor parts by the flow of a refrigerant such as air, wherein nozzles are attached onto opposite side surfaces of heat-generating semiconductor parts fitted side surfaces of the plurality of heat sinks to supply the refrigerant to the plurality of heat sinks, each nozzle having a substantially rectangular cross section parallel to the board.

Preferably, when the ratio (R) of the distance (Wd) between the adjacent heat sinks to the pitch (Wf+Wd) of the plurality of heat sinks is not less than 0.00 and below 0.02, the nozzles are placed such that the ratio (Wn/Wf) of the nozzle width (Wn) in a direction (X direction) that the refrigerant flows within the heat sinks to the heat sink width (Wf) in the X direction is not less than 0.16 and not more than 0.35.

When the ratio (R) is not less than 0.02 and below 0.06, the nozzles are placed such that the ratio (Wn/Wf) is not less than 0.20 and not more than 0.41.

When the ratio (R) is not less than 0.06 and below 0.12, the nozzles are placed such that the ratio (Wn/Wf) is not less than 0.21 and not more than 0.46.

When the ratio (R) is not less than 0.12 and below 0.20, the nozzles are placed such that the ratio (Wn/Wf) is not less than 0.22 and not more than 0.48.

When the ratio (R) is not less than 0.20 and below 1.00, the nozzles are placed such that the ratio (Wn/Wf) is not less than 0.23 and not more than 0.50.

Furthermore, preferably, the heat sinks are of a flat plate fin type, and the flat plate fin of the heat sinks has a thickness of not less than 0.2 mm and not more than 0.8 mm. In addition, the flow passage between the flat plate fins of the heat sinks is set to not less than 0.4 mm and not more than 1.2 mm, and the ratio of the height of the heat sinks (in the Z direction) to the heat sink width (Wf, in the X direction) is set to not less than 0.25 and not more than 0.45.

The electronic device of the present invention is structured such that a plurality of heat sinks are attached onto a plurality of heat-generating semiconductor parts mounted on a board, respectively and that nozzles are attached onto opposite side surfaces of heat-generating semiconductor parts fitted side surfaces of the plurality of heat sinks, each nozzle having a substantially rectangular cross section parallel to the board.

Further, when the ratio (R) of the distance (Wd) between the adjacent heat sinks to the pitch (Wf+Wd) of the plurality of heat sinks is not less than 0.00 and below 0.02, the nozzles are placed such that the ratio (Wn/Wf) of the nozzle width (Wn) in a direction (X direction) that the refrigerant flows within the heat sinks to the heat sink width (Wf) in the X direction is not less than 0.16 and not more than 0.35.

When the ratio (R) is not less than 0.02 and below 0.06, the nozzles are placed such that the ratio (Wn/Wf) is not less than 0.20 and not more than 0.41.

When the ratio (R) is not less than 0.06 and below 0.12, the nozzles are placed such that the ratio (Wn/Wf) is not less than 0.21 and not more than 0.46.

When the ratio (R) is not less than 0.12 and below 0.20, the nozzles are placed such that the ratio (Wn/Wf) is not less than 0.22 and not more than 0.48.

When the ratio (R) is not less than 0.20 and below 1.00, the nozzles are placed such that the ratio (Wn/Wf) is not less than 0.23 and not more than 0.50.

Since the cooling apparatus for electronic devices according to the present invention is constructed as described above, exhaust chambers optimal for the flow of air discharged from the heat sinks are defined between the nozzles. More specifically, even if the heat-generating semiconductor parts are very tightly mounted in a plane so that difficulty is experienced to ensure spaces sufficient for the exhaust air running between the heat-generating semiconductor parts or between the heat sinks, spaces sufficient for enabling the exhaust air to be discharged from the heat sinks are attainable between the heat sink top surfaces on the opposite side from the heat-generating semiconductor parts and the outer side surfaces of the nozzles. These spaces can reduce the flow velocity of the exhaust air discharged from the heat sinks, thereby reducing the flow resistance in the exhaust air flow path so that the cooling performance of the cooling apparatus can be improved. In addition, the reduction of the flow resistance in the exhaust air flow path permits the sufficient flow of cooling air to even the heat sinks remote from the exit, thereby realizing uniform cooling air distribution and uniform temperature distribution to the heat-generating semiconductor parts. Moreover, the reduction of the flow velocity of the exhaust air in the exhaust flow path prevents the cooling apparatus from generating noises. These effects also apply to the cases that the calorific value of the heat-generating semiconductor parts is extremely large.

Furthermore, when the heat sinks are of the flat plate type, the passages defined between the flat plate fins show extremely small flow resistances, thereby realizing a cooling apparatus having a reduced pressure loss and a high cooling performance. The flat plate fins can be made to have a thickness of not less than 0.2 mm and not more than below 0.8 mm or the passages between the fins can be designed to have a width of not less than 0.4 mm and not more than 1.2 mm. The ratio of the height of the heat sinks (in the Z direction) to the width of the heat sinks (Wf, in the X direction) can be set to not less than 0.25 and not more than 0.45. In these cases, the electronic device cooling apparatus can exhibit the maximum cooling performance at a given air blowing power.

DESCRIPTION OF THE PREFERRED EMBODIMENTS

A description will be made hereinbelow of a cooling apparatus for electronic devices according to embodiments of the present invention with reference to FIGS. 1 to 4.

Figure 1:
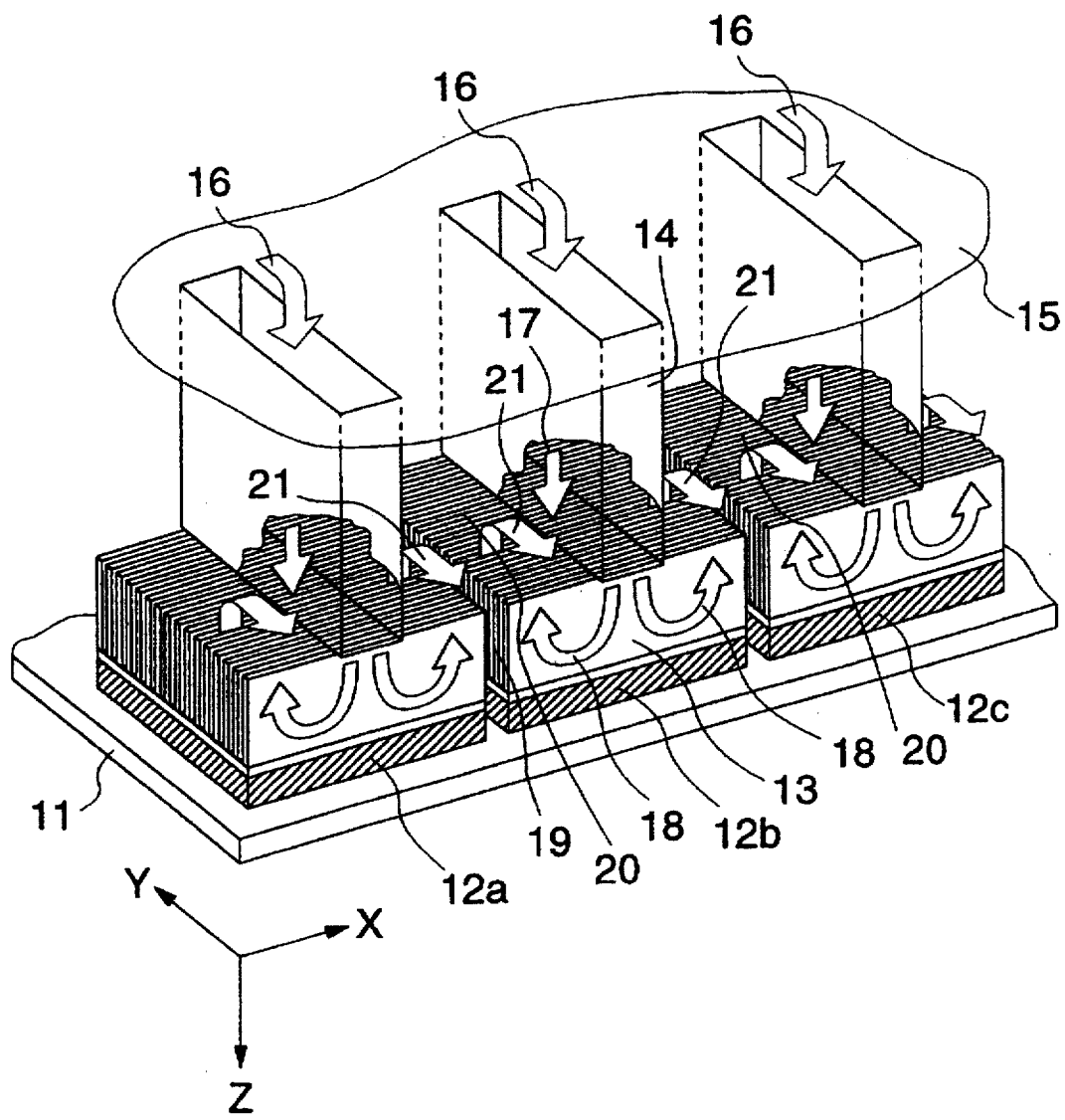
FIG. 1 is a perspective view showing a structure of a first embodiment of the present invention.

As shown in FIG. 1, a board 11 such as a printed circuit board, or a ceramics board carries a plurality of heat-generating semiconductor parts 12a, 12b and 12c (three in the illustration), typically electronic circuit modules having one or more LSIs, arranged densely in close proximity to one another. The heat-generating semiconductor parts 12a, 12b and 12c have an approximately rectangular parallelopiped shape. Each semiconductor part 12a, 12b and 12c is provided on the upper side thereof with a heat sink 13 which effectively transfers heat from the semiconductor device 21 to cooling air. The heat sink 13 includes, for example, a plurality of tabular fins arranged side by side. Preferably, the heat sink 13 is made of a material having large heat conductivity, such as copper, aluminum or heat-conductive ceramics. In addition to the flat plate configuration, for example, the heat sinks 13 can take a pin fin configuration or a slit fin configuration used for heat exchangers and others.

The heat sink 13 is integrated with the associated semiconductor parts 12a, 12b and 12c in a heat-conducting relationship therewith through, for example, a heat-conducting grease, heat-conducting sheet or a heat-conducting adhesive. A nozzle 14 is hermetically connected to the side of each heat sink 13 opposite to the circuit board, for example, to the upper surface of the heat sink 13 so as to supply cooling air into the heat sink 13 without any leakage. The nozzles 14 have a substantially rectangular cross section parallel to the board and are positioned at the approximate center portions of the heat sinks 13 in the X direction indicated in the illustration. Further, the length of the nozzles 14 in the Y direction in the illustration is equal to or greater than the length of the heat sinks 13 in the Y direction. On the nozzles 14, there is located a chamber (whose wall surface is designated at numeral 15) for distributing cooling air from an air blower (not shown). The cooling air from the air blower flows into the nozzles 14 as shown at numeral 16 and then advances within the nozzles 14 as shown at numeral 17 and subsequently reaches the heat sinks 13. Each air flow introduced into between the flat plate fins being the heat sinks 13 flows toward the base portion of the fins as shown at numeral 18 and then divides into two portions which in turn, proceed to make U-turns to further flow toward a gap 19 between the adjacent heat sinks 13 or the top surface of the heat sink 13. The air flows discharged from the adjacent heat sinks 13 joins with each other in the gap 19 between the heat sinks 13 or at the top surface of the heat sinks 13 being a higher position than the gap 19 therebetween to make one flow which subsequently advances in an exhaust space 20 between the nozzles 14 and is then discharged as shown at numeral 21.

Figure 2:
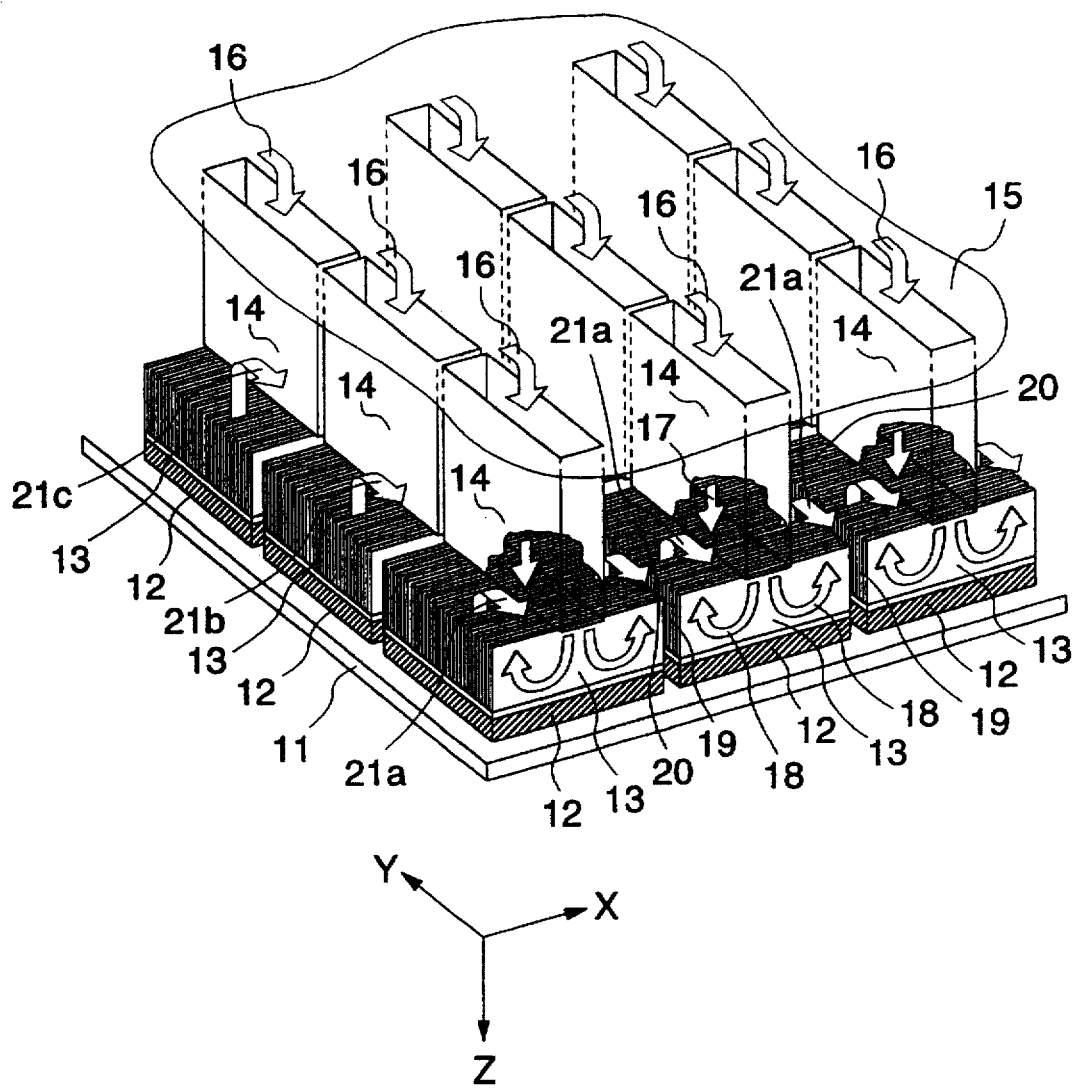
FIG. 2 is a perspective view showing a structure of a second embodiment of the present invention.

FIG. 2 is a perspective view showing another embodiment of this invention. As compared with the embodiment of FIG. 1, in the FIG. 2 embodiment a plurality of heat-generating semiconductor parts 12 are two-dimensionally mounted in the depth direction (in the Y direction). Although in the illustrated embodiment, a group of heat-generating semiconductor parts 12 includes nine semiconductor parts which are arranged in three columns each containing three semiconductor parts 12, limitation is not imposed on the number of heat-generating semiconductor parts to be mounted but there is no limit to the number thereof as long as they satisfy a two-dimensionally arranging condition. In the illustration, the structures of the heat-generating semiconductor parts 12, heat sinks 13, nozzles 14 and others are the same as those in the embodiment of FIG. 1.

One difference from the embodiment of FIG. 1 is the way how each air flow discharged from the heat sink 13 flows into an exhaust space 20 between the nozzles 14. As obvious from the illustration, the nozzles 14 are successively arranged in a row in the Y direction and the exhaust spaces 20 defined between the nozzles 14 are coupled to each other in the Y direction, thus making one exhaust tunnel. The air flows from the heat sinks 13 arranged in the Y direction join with each other as shown at numerals 21c, 21b and 21a while flowing within the exhaust tunnel and finally advance toward the external. The exhaust air flow 21c from the deepest heat sink 13 in the Y direction flows at the uppermost position (in the direction opposite to the Z direction) within the exhaust tunnel. The next exhaust air flow 21b proceeds under the exhaust air flow 21c while the air exhaust air flow 21a advances at the lowermost portion within the exhaust tunnel.

As described above, in the embodiments of FIGS. 1 and 2 the exhaust chambers or the exhaust tunnels are formed between the nozzles 14 to enable the air from the heat sinks 13 to effectively flow. Thus, even if the heat-generating semiconductor parts are very tightly mounted in a plane to make it difficult to ensure a sufficient space between the heat sinks 13 for the exhaust air flow, it is possible to ensure a sufficient space for discharging exhaust air from the heat sinks 13 by utilizing the spaces defined by the heat sink top surfaces on the opposite side from the heat-generating semiconductor parts and the outer side surfaces of the nozzles 14. Accordingly, it is possible to reduce the flow velocity of the exhaust air from the heat sinks 13, thereby reducing the flow resistance in the exhaust flow passages, so that the cooling ability of the cooling apparatus can be improved. In addition, the reduction of the flow resistance in the exhaust flow passages enables the cooling air to satisfactorily reach even the Y-direction deepest heat sinks remote from the exit as described in the embodiment of FIG. 2, whereupon it is possible to realize uniform cooling air distribution and uniform temperature distribution to the heat-generating semiconductor parts. Moreover, because of the reduction of the flow velocity in the exhaust flow passages, the noises of the cooling apparatus are reducible. These effects similarly apply to the cases that the calorific value of the heat-generating semiconductor parts is extremely large.

A description will be made with reference to FIGS. 3 and 4 in terms of the experimental results on preferable ranges of the nozzle width in the above-described embodiments of FIGS. 1 and 2. The nozzle width (the nozzle dimension in the X direction) is considered to most affect the cooling performance of the electronic device cooling apparatus according to the present invention. Further, the influence of the nozzle width on the cooling performance is considered to greatly vary in accordance With the width of the gap between the heat sinks 13, i.e., the heat-generating part density in the X direction.

Figure 3:
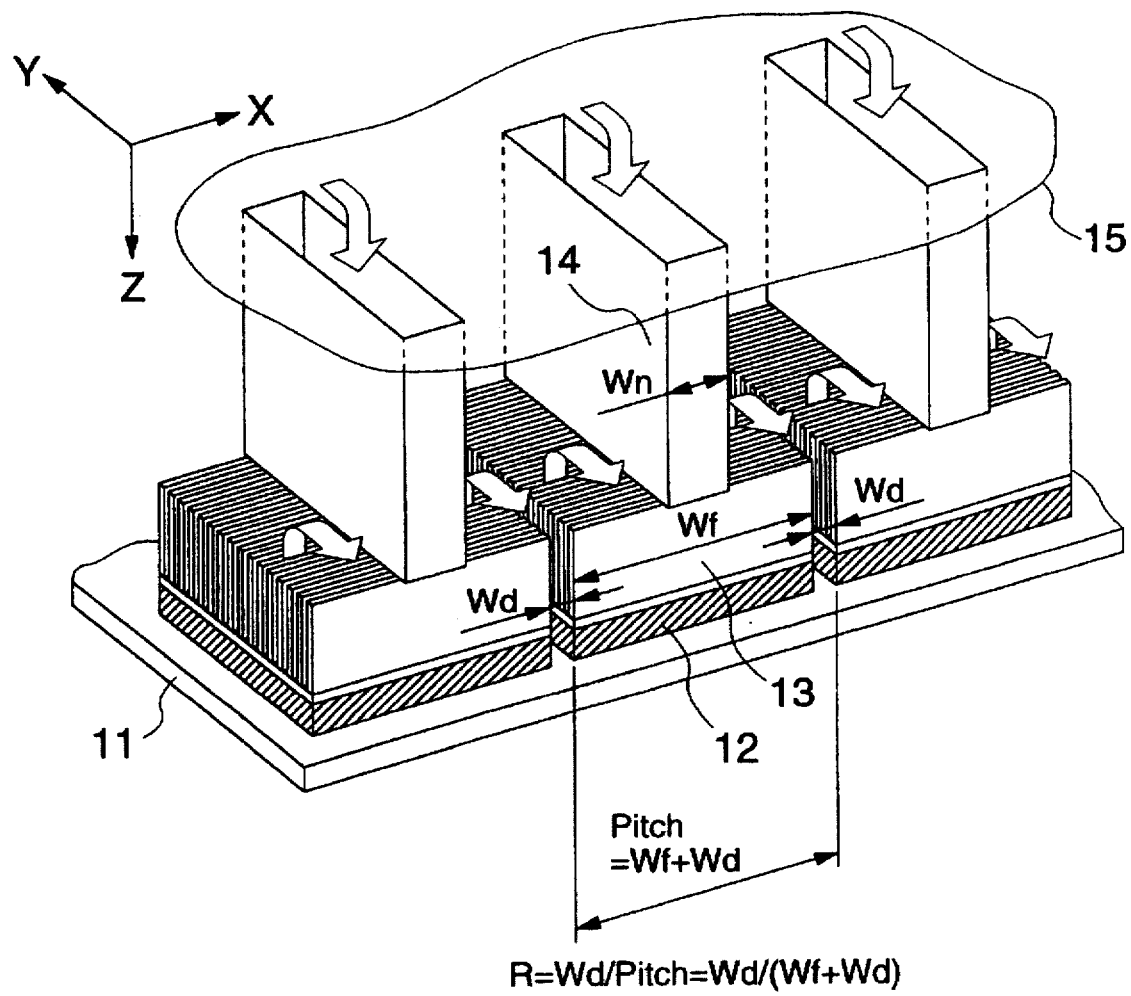
FIG. 3 is a perspective view showing dimensions taken in this invention, at symbols or marks.
Figure 4:
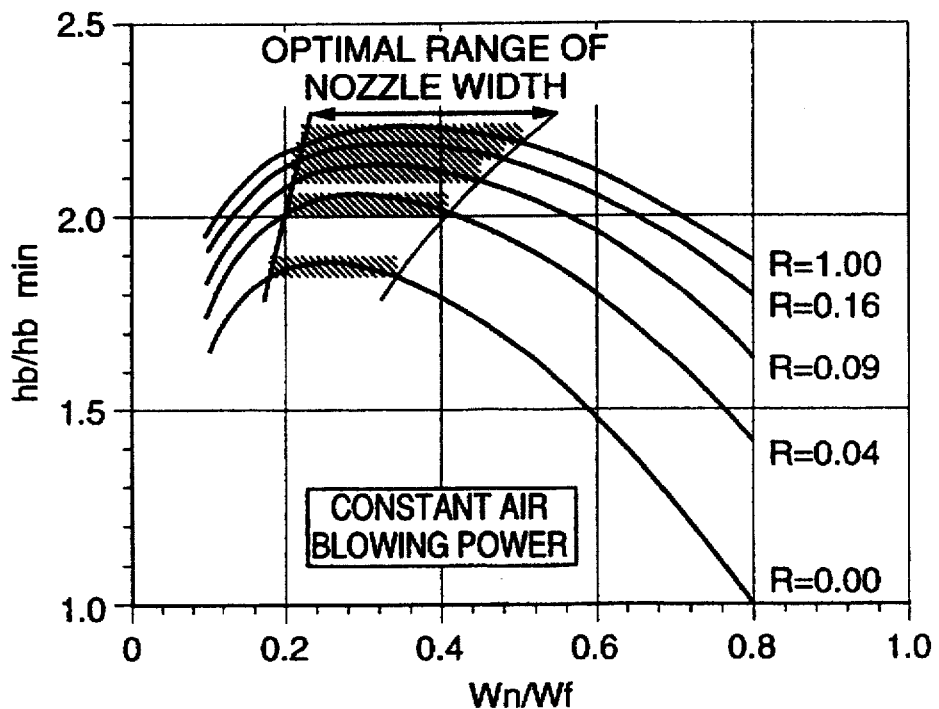
FIG. 4 is an illustration of the optimal values (values obtained by experiments) taken for the nozzle width.
Figure 5:
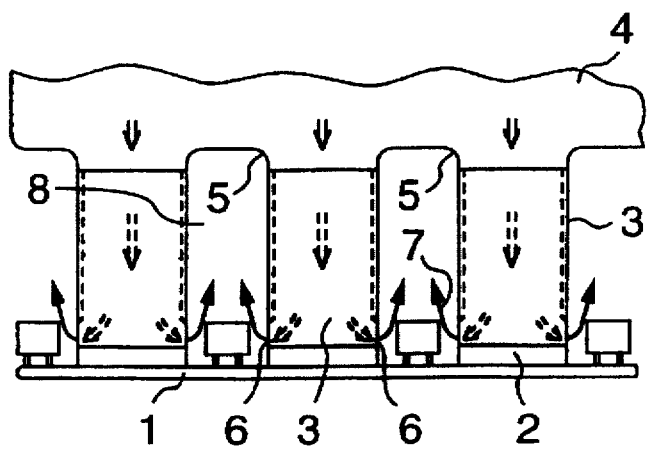
FIG. 5 is a side elevational view of a conventional electronic device cooling apparatus.
Figure 6:
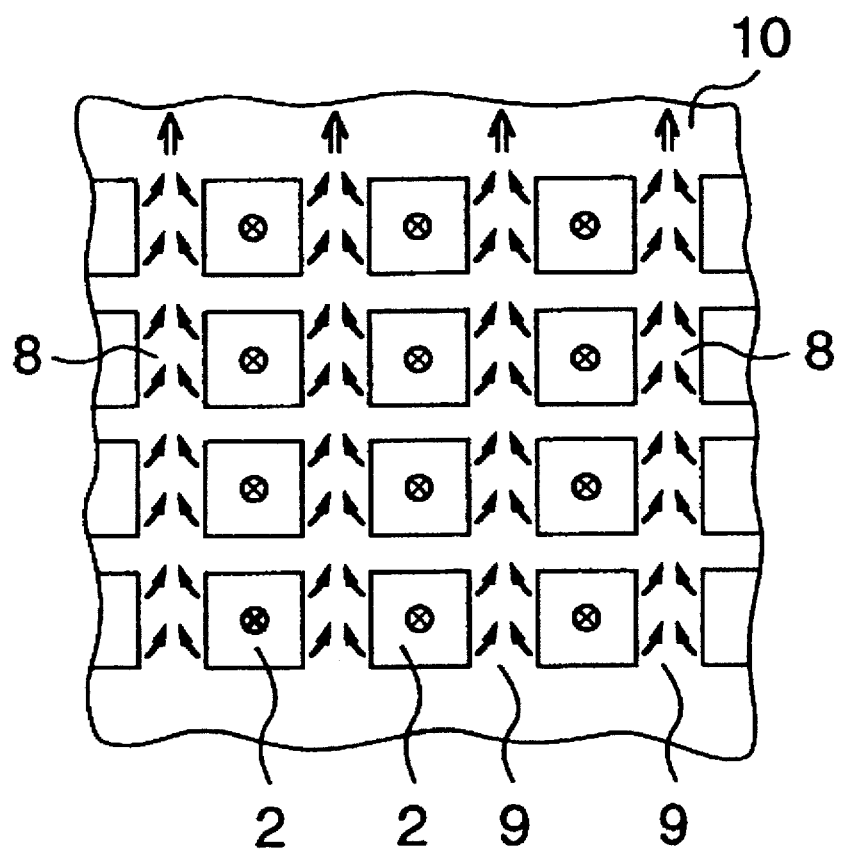
FIG. 6 is a top view of a conventional electronic device cooling apparatus.

In FIG. 3, the nozzle width is designated at character Wn, the width of the heat sink 13 (in the X direction) is denoted at Wf, the width of the gap between the heat sinks 13 (in the X direction) is depicted at Wd, and the pitch of the heat sinks 13 (in the X direction) is represented by Pitch. The density of the heat-generating parts in the X direction is expressed by the ratio R of the width Wd of the gap between the heat sinks 13 to the pitch Pitch of the heat sinks 13 in the X direction. Thus, R=0 signifies that the side surfaces of the adjacent heat sinks 13 are in contacting relation to each other, while R=1 means that the adjacent heat sinks 13 are considerably remote from each other. The ratio Wn/Wf means the ratio of the nozzle width Wn to the width Wf of the heat sink 13.

In relation to flat plate type heat sinks whose structures are optimized under a given condition, measurements are made on the heat transfer coefficient (in a fin base area reference) of the heat sink 13 to the quantity of cooling air and the pressure loss representative of the flow resistance when R and Wn/Wf separately vary. The measurement results are indicated by air blowing powers expressed by the product of the air quantity and the pressure loss. FIG. 4 shows the results of the range of Wn/Wf where the heat transfer coefficient comes to a maximum value under a constant air blowing power. Although FIG. 4 illustrates the cases that the air blowing power is 20 W, even if the air blowing power varies, the optimal range does not substantially change. In the illustration, the vertical axis indicates values obtained by dividing the heat transfer coefficient hb in the fin base area reference by its minimum value hbmin. Further, in the illustration, R is treated as a parameter. As obvious from the illustration, the range of Wn/Wf to maximize the heat transfer coefficient, i.e., the range of the optimal value of Wn/Wf, is 0.16 to 0.35 when R=0.00, 0.20 to 0.41 when R=0.04, 0.21 to 0.46 when R=0.09, 0.22 to 0.48 when R=0.16, and 0.23 to 0.50 when R=1.00. The areas hatched and interposed between two solid lines show the optimal range of Wn/Wf. The value of R lies within the range centering on the R values used in the experiments. That is, (1) In the case that the ratio (R) of the distance (Wd) between the adjacent heat sinks 13 to the pitch (Pitch=Wf+Wd) of the plurality of heat sinks 13 is not less than 0.00 and below 0.02, if the nozzles are installed such that the ratio (Wn/Wf) of the nozzle width (Wn) in a direction (the X direction) that the refrigerant within the heat sinks 13 flows to the heat sink width (Wf) in the X direction is not less than 0.16 and not more than 0.35, the most appropriate cooling performance is obtainable in relation to a given air blowing power.

(2) In the case that the ratio (R) is not less than 0.02 and below 0.06, if the nozzles are installed such that the ratio (Wn/Wf) is not less than 0.20 and not more than 0.41, the most appropriate cooling performance is also obtainable in relation to a given air blowing power.

(3) In the case that the ratio (R) is not less than 0.06 and below 0.12, if the nozzles are installed such that the ratio (Wn/Wf) is not less than 0.21 and not more than 0.46, the most appropriate cooling performance is also obtainable in relation to a given air blowing power.

(4) In the case that the ratio (R) is not less than 0.12 and below 0.20, if the nozzles are installed such that the ratio (Wn/Wf) is not less than 0.22 and not more than 0.48, the most appropriate cooling performance is also obtainable in relation to a given air blowing power.

(5) In the case that the ratio (R) is not less than 0.20 and below 1.00, if the nozzles are installed such that the ratio (Wn/Wf) is not less than 0.23 and not more than 0.50, the most appropriate cooling performance is also obtainable in relation to a given air blowing power.

Although being not described about the heat sink configuration in the above explanation, when particularly the heat sinks are of the flat plate type, because the flow resistance is extremely small in the flow passages defined between the flat plate fins, the electronic device cooling apparatus having a reduced pressure loss and a high cooling performance can be realized. Further, when the thickness of the flat plate fins is set to not less than 0.2 mm and not more than 0.8 mm or the width of the flow passages is set to not less than 0.4 mm and not more than 1.2 mm, or when the ratio of the height of the heat sinks 13 (in the Z direction) to the width (Wf, in the X direction) of the heat sinks 13 is set to not less than 0.25 and not more than 0.45, the most appropriate cooling performance is also obtainable in relation to a given air blowing power. However, the optimal value of the nozzle width in this invention is not limited with respect to the structure of the heat sinks 13 but is applicable to heat sinks with various configurations.

As described above, according to the present invention, even if the heat-generating semiconductor parts are very tightly mounted in a plane to make it difficult to ensure a sufficient space between the heat sinks 13 for the exhaust air flow, it is possible to ensure a sufficient space for discharging exhaust air from the heat sinks 13 by utilizing the spaces defined by the heat sink top surfaces on the opposite side from the heat-generating semiconductor parts and the outer side surfaces of the nozzles 14. Accordingly, it is possible to reduce the flow velocity of the exhaust air from the heat sinks 13, thereby reducing the flow resistance in the exhaust flow passages, so that the cooling ability of the cooling apparatus can be improved. In addition, the reduction of the flow resistance in the exhaust flow passages enables the cooling air to sufficiently reach even the Y-direction deepest heat sinks remote from the exit, whereupon it is possible to realize uniform cooling air distribution and uniform temperature distribution to the heat-generating semiconductor parts. Moreover, because of the reduction of the flow velocity in the exhaust flow passages, the noises of the cooling apparatus are reducible. These effects similarly apply to the cases that the calorific value of the heat-generating semiconductor parts is extremely large.

Moreover, when the nozzle width is optimally determined with respect to the width of the gap between the heat sinks 13 which is within a given range, it is possible to realize a cooling apparatus which shows the highest cooling performance in terms of an almost arbitrary air blowing power. In addition, when the heat sinks 13 are designed to be of the flat plate fin type, the flow resistance in the passages defined between the flat plate fins is extremely small, so that the electronic device cooling apparatus having a reduced pressure loss and a high cooling performance can be realized. Still further, if the thickness of the flat plate fins, the width of the inter-fin passages and the height of the heat sinks 13 are set to be within given ranges, it is also possible to realize an electronic device cooling apparatus which shows the highest cooling performance in terms of an almost arbitrary air blowing power.

What is claimed is:

1. A cooling apparatus for an electronic device comprising a plurality of heat-generating semiconductor parts mounted on a board and a plurality of heat sinks attached onto said plurality of heat-generating semiconductor parts, respectively, to be thermally coupled thereto to dissipate heat of said heat-generating semiconductor parts by flow of a refrigerant such as air, said cooling apparatus comprising nozzles provided on opposite side surfaces of heat-generating semiconductor part fitted side surfaces of said plurality of heat sinks to supply said refrigerant to said plurality of heat sinks, each of said nozzles having a substantially rectangular cross section parallel to the board, and being made such that the ratio (R) of a distance (Wd) between the adjacent heat sinks to a pitch (Pitch=Wf+Wd) of said plurality of heat sinks is not less than 0.00 and below 0.02, and the ratio (Wn/Wf) of a nozzle width (Wn) in a direction that said refrigerant flows within said heat sinks to a heat sink width (Wf) in the said direction is not less than 0.16 and not more than 0.35.

2. A cooling apparatus for an electronic device according to claim 1, wherein said heat sinks are of a flat plate fin type.

3. A cooling apparatus for an electronic device according to claim 2, wherein a thickness of flat plate fins of said heat sinks is not less than 0.2 mm and not more than 0.8 mm.

4. A cooling apparatus for an electronic device according to claim 2, wherein a width of a passage formed between flat plate fins of said heat sinks is not less than 0.4 mm and not more than 1.2 mm.

5. A cooling apparatus for an electronic device according to claim 1, wherein the ratio of a height of said heat sinks in a vertical direction to a width (Wf) of said heat sinks in a horizontal direction is not less than 0.25 and not more than 0.45.

6. A cooling apparatus for an electronic device according to claim 1, wherein a thickness of flat plate fins of said heat sinks is not less than 0.2 mm and not more than 0.8 mm.

7. A cooling apparatus for an electronic device comprising a plurality of heat-generating semiconductor parts mounted on a board and a plurality of heat sinks attached onto said plurality of heat-generating semiconductor parts, respectively, to be thermally coupled thereto to dissipate heat of said heat-generating semiconductor parts by flow of a refrigerant such as air, said cooling apparatus comprising nozzles provided on opposite side surfaces of heat-generating semiconductor part fitted side surfaces of said plurality of heat sinks to supply said refrigerant to said plurality of heat sinks, each of said nozzles having a substantially rectangular cross section parallel to the board, and being made such that the ratio (R) of a distance (Wd) between the adjacent heat sinks to a pitch (Pitch=Wf+Wd) of said plurality of heat sinks is not less than 0.02 and below 0.06, and the ratio (Wn/Wf) of a nozzle width (Wn) in a direction that said refrigerant flows within said heat sinks to a heat sink width (Wf) in the said direction is not less than 0.20 and not more than 0.41.

8. A cooling apparatus for an electronic device comprising a plurality of heat-generating semiconductor parts mounted on a board and a plurality of heat sinks attached onto said plurality of heat-generating semiconductor parts, respectively, to be thermally coupled thereto to dissipate heat of said heat-generating semiconductor parts by flow of a refrigerant such as air, said cooling apparatus comprising nozzles provided on opposite side surfaces of heat-generating semiconductor part fitted side surfaces of said plurality of heat sinks to supply said refrigerant to said plurality of heat sinks, each of said nozzles having a substantially rectangular cross section parallel to the board, and being made such that a ratio (R) of a distance (Wd) between the adjacent heat sinks to a pitch (Pitch=Wf+Wd) of said plurality of heat sinks is not less than 0.06 and below 0.12, and a ratio (Wn/Wf) of a nozzle width (Wn) in a direction that said refrigerant flows within said heat sinks to a heat sink width (Wf) in the said direction is not less than 0.21 and not more than 0.46.

9. A cooling apparatus for an electronic device comprising a plurality of heat-generating semiconductor parts mounted on a board and a plurality of heat sinks attached onto said plurality of heat-generating semiconductor parts, respectively, to be thermally coupled thereto to dissipate heat of said heat-generating semiconductor parts by flow of a refrigerant such as air, said cooling apparatus comprising nozzles provided on opposite side surfaces of heat-generating semiconductor part fitted side surfaces of said plurality of heat sinks to supply said refrigerant to said plurality of heat sinks, each of said nozzles having a substantially rectangular cross section parallel to the board, and being made such that the ratio (R) of a distance (Wd) between the adjacent heat sinks to a pitch (Pitch=Wf+Wd) of said plurality of heat sinks is not less than 0.12 and below 0.20, and the ratio (Wn/Wf) of a nozzle width (Wn) in a direction that said refrigerant flows within said heat sinks to a heat sink width (Wf) in the said direction is not less than 0.22 and not more than 0.48.

10. A cooling apparatus for an electronic device comprising a plurality of heat-generating semiconductor parts mounted on a board and a plurality of heat sinks attached onto said plurality of heat-generating semiconductor parts, respectively, to be thermally coupled thereto to dissipate heat of said heat-generating semiconductor parts by flow of a refrigerant such as air, said cooling apparatus comprising nozzles provided on opposite side surfaces of heat-generating semiconductor part fitted side surfaces of said plurality of heat sinks to supply said refrigerant to said plurality of heat sinks, each of said nozzles having a substantially rectangular cross section parallel to the board, and being made such that the ratio (R) of a distance (Wd) between the adjacent heat sinks to a pitch (Pitch=Wf+Wd) of said plurality of heat sinks is not less than 0.20 and below 1.00, and the ratio (Wn/Wf) of a nozzle width (Wn) in a direction that said refrigerant flows within said heat sinks to a heat sink width (Wf) in the said direction is not less than 0.23 and not more than 0.50.

11. A cooling apparatus for an electronic device according to claim 10, wherein said heat sinks are of a flat plate fin type.

12. A cooling apparatus for an electronic device according to claim 11, wherein a thickness of flat plate fins of said heat sinks is not less than 0.2 mm and not more than 0.8 mm.

13. A cooling apparatus for an electronic device according to claim 12, wherein a width of a passage formed between flat plate fins of said heat sinks is not less than 0.4 mm and not more than 1.2 mm.

14. A cooling apparatus for an electronic device according to claim 10, wherein a width of a passage formed between flat plate fins of said heat sinks is not less than 0.4 mm and not more than 1.2 mm.

15. A cooling apparatus for an electronic device according to claim 14, wherein the ratio of a height of said heat sinks in a vertical direction to a width (Wf) of said heat sinks in a horizontal direction is not less than 0.25 and not more than 0.45.

16. A cooling apparatus for an electronic device according to claim 10, wherein a thickness of flat plate fins of said heat sinks is not less than 0.2 mm and not more than 0.8 mm.

* * * * *